(12) United States Patent
Kim et al.

(10) Patent No.: US 7,608,383 B2
(45) Date of Patent: Oct. 27, 2009

(54) UV RADIATION BLOCKING PROTECTIVE LAYERS COMPATIBLE WITH THICK FILM PASTES

(75) Inventors: Young H. Kim, Hockessin, DE (US); Gann Xu, Boothwyn, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/175,633

(22) Filed: Jul. 18, 2008

(65) Prior Publication Data

US 2008/0274430 A1 Nov. 6, 2008

Related U.S. Application Data

(63) Continuation of application No. 11/050,270, filed on Feb. 3, 2005, now Pat. No. 7,402,373.

(51) Int. Cl.
G03F 7/00 (2006.01)
G03F 7/004 (2006.01)

(52) U.S. Cl. ............... 430/270.1; 430/281.1; 430/311; 430/330

(58) Field of Classification Search ............... 430/270.1, 430/281.1, 311, 330
See application file for complete search history.

(56) References Cited

U.S. PATENT DOCUMENTS

| | | | |
|---|---|---|---|
| 4,373,019 A | 2/1983 | Watanabe et al. |
| 4,833,067 A | 5/1989 | Tanaka et al. |
| 4,939,070 A | 7/1990 | Brunsvold et al. |
| 4,985,332 A | 1/1991 | Anderson |
| 5,164,286 A | 11/1992 | Blakeney et al. |
| 5,362,927 A | 11/1994 | Ezaki |
| 5,506,090 A | 4/1996 | Gardner et al. |
| 5,601,638 A | 2/1997 | Fukuda et al. |
| 5,639,579 A | 6/1997 | Hayashi et al. |
| 5,756,267 A | 5/1998 | Matsuda et al. |
| 5,879,856 A | 3/1999 | Thackeray et al. |
| 5,910,392 A | 6/1999 | Nozaki et al. |
| 5,942,367 A | 8/1999 | Watanabe et al. |
| 6,060,207 A | 5/2000 | Shida et al. |

(Continued)

FOREIGN PATENT DOCUMENTS

DE 234 196 A3 3/1986

(Continued)

OTHER PUBLICATIONS

Wun-ku Wang et al., Electrical Characterization of Polymer Thick Film Resistor, The International Society for Optical Engineering, 1999, pp. 619-624, vol. 3906.

(Continued)

*Primary Examiner*—Amanda C. Walke

(57) ABSTRACT

This invention relates to novel compositions comprising a protective polymer layer and a UV blocking agent. This is used in the fabrication of electronic devices using thick film pastes. The present invention is also an electronic device fabrication process using the compositions. The protective polymer layer is fabricated from materials, which are insoluble after irradiation in the ester-type solvents contained in the thick film paste. By appropriate selection of protective film polymers, the protective film can be compatible with the thick film paste and can be further used to shield portions of the thick film paste from UV irradiation.

10 Claims, 1 Drawing Sheet

U.S. PATENT DOCUMENTS

| | | | |
|---|---|---|---|
| 6,060,213 | A | 5/2000 | Kodama |
| 6,060,841 | A | 5/2000 | Niiyama |
| 6,074,893 | A | 6/2000 | Nakata et al. |
| 6,107,360 | A | 8/2000 | Kaneko et al. |
| 6,238,842 | B1 | 5/2001 | Sata et al. |
| 6,410,748 | B1 | 6/2002 | Shida et al. |
| 6,534,235 | B1 | 3/2003 | Hanobata et al. |
| 6,534,671 | B2 | 3/2003 | Wu et al. |
| 6,558,871 | B1 | 5/2003 | Takahashi et al. |
| 6,613,499 | B2 | 9/2003 | Chang |
| 6,653,043 | B1 | 11/2003 | Hanobata |
| 6,769,945 | B2 | 8/2004 | Chang et al. |
| 6,798,127 | B2 | 9/2004 | Mao et al. |
| 6,811,950 | B2 | 11/2004 | Kondo |
| 7,008,754 | B2 | 3/2006 | Kato et al. |
| 7,125,648 | B2 | 10/2006 | Nagase |
| 7,186,498 | B2 | 3/2007 | Gries |
| 2002/0001720 | A1 | 1/2002 | Clough |
| 2002/0058207 | A1 | 5/2002 | Urano et al. |
| 2002/0074932 | A1 | 6/2002 | Bouchard et al. |
| 2002/0094382 | A1 | 7/2002 | Imai et al. |
| 2002/0094483 | A1 | 7/2002 | Hattori et al. |
| 2002/0106589 | A1 | 8/2002 | Rodney et al. |
| 2003/0073042 | A1 | 4/2003 | Cernigliaro et al. |
| 2003/0170559 | A1 | 9/2003 | Mizutani et al. |
| 2004/0018453 | A1 | 1/2004 | Anzures et al. |
| 2004/0137364 | A1 | 7/2004 | Kim |
| 2004/0140861 | A1 | 7/2004 | Alvarez |
| 2004/0170925 | A1 | 9/2004 | Roach et al. |
| 2004/0173818 | A1 | 9/2004 | Cheng |
| 2005/0058953 | A1 | 3/2005 | Cahi et al. |
| 2005/0112503 | A1 | 5/2005 | Kanda et al. |
| 2005/0130082 | A1 | 6/2005 | Kanda |
| 2005/0227168 | A1 | 10/2005 | Kim et al. |
| 2005/0282094 | A1 | 12/2005 | Kim et al. |
| 2006/0154158 | A1 | 7/2006 | Washio |

FOREIGN PATENT DOCUMENTS

| | | |
|---|---|---|
| EP | 0 936 504 A1 | 8/1999 |
| EP | 936504 A | 8/1999 |
| EP | 1 184 723 A2 | 3/2002 |
| JP | 10340666 | 12/1998 |
| JP | 10340666 A | 12/1998 |
| JP | 2000/108259 | 4/2000 |
| JP | 2000187327 A | 4/2000 |
| JP | 2000/187327 | 7/2000 |
| JP | 2001/111217 | 4/2001 |
| JP | 2001111217 A | 4/2001 |
| JP | 2001/155626 | 6/2001 |
| JP | 2001155626 A | 6/2001 |
| WO | WO 2005/116761 A2 | 12/2005 |

OTHER PUBLICATIONS

C.E Carraher Jr., Polymer Chemisty, Fifth Edition, New YorkMarcel Dekker Inc. (Book Not Supplied).

S.L. Rosen, Polymers, The Kirk-Othmer Encyclopedia of Chemical Technology, pp. 899-901, vol. 19, Fourth Edition , John Wiley and Sons., New York.

J.V. Crivello, The Chemistry of Photoacid Generating Compounds in Polymeric Materials Science and Engineering, American Chemical Society Meeting, Miami FL, Sep. 11-15-1989, pp. 62-66, vol. 61.

T.A. Pressley, Method Development for Semivolative Organics in Municipal Sludge, American Chemical Society Meeting, Miami, FL, Sep. 11-15, 1989, pp. 62-66.

Chen et al., Solution Properties of Singe-Walled Carbon Nanotubes, Science, 1998, pp. 95-98, vol. 282.

Zhaoxia Jin et. al., Nonliner Optical Properties of Some Polymer/Multi-Walled Carbon Nanotube Composites, Chemical Physics Letters, 2000, pp. 505-510, vol. 318.

English Language Machine Translation of JP2000-187327.

Reiser et. al., Photoreactive Polymers, The Science and Technology of Resists, 1989, John Wiley & Sons, Inc., Canada.

C.E. Carraher Jr. Polymer Chemistry, Fifth Edition, New York, Marcel Dekker Inc. 1989 (Book Not Included).

Wun-Ku Wang et. al., Electrical Characterization of Polymer Thick Film Resistor, The International Society For Optical Engineering, 1999, vol. 3906:619-624.

J.V. Crivello, The Chemistry of Photoacid Generating Compounds in Polymeric Materials Science and Engineering, American Chemical Society Meeting, 1989, vol. 61:62-66.

Chen et. al., Solution Properties of Single-Walled Carbon Nanotubes, Science, 1998, vol. 282:95-98.

Zhaoxia et. al., Nonliner Optical Properties of Some Polymer/Multi-Walled Carbon Nanotube Composites, Chemical Physics Letters, 2000, vol. 318:505-519.

M. Dresselhaus et. al., Physics World-Physics Web, Carbon Nanotube, 1998, pp. 1-10.

S.L. Rosen, Polymers, The Kirk Othmer Encyclopedia of Chemical Technology, Fourth Edition, John Wiley & Sons, vol. 19:881-904 1998.

UV RADIATION BLOCKING PROTECTIVE LAYERS COMPATIBLE WITH THICK FILM PASTES

This application is a continuation of, and claims the benefit of, U.S. application Ser. No. 11/050,270 (filed Feb. 3, 2005, now U.S. Pat. No. 7,402,373), which is by this reference incorporated in its entirety as a part hereof for all purposes, and which claimed the benefit of U.S. Provisional Applications 60/542,060 and 60/620,751.

FIELD OF THE INVENTION

The present invention relates to a composition and a process using a special protective layer for the fabrication of electronic devices that use thick film pastes.

TECHNICAL BACKGROUND

The present invention relates to a composition and a process for constructing electronic devices wherein a substrate is coated with a conducting layer that is further coated with a thick film paste. The thick film paste may contain materials such as glass frit, various conductors, photo-imageable polymers and, usually a solvent. In the fabrication of these devices, photo-definable protective layers may be used to isolate photoimageable thick film deposits from other elements of these electronic devices such as conductive layers. A problem arises in some of these devices in that the solvent used in the thick film pastes, usually an ester or ether type solvent, is frequently aggressive to the polymer protective layer and may lead to short circuits. This can lead to problems on the surface of the substrate such as pealing or dissolution of the protective layer from the substrate when that layer is exposed to the thick film paste. An additional utility of such protective layers is the blocking of UV radiation so that the amount of radiation from the backside of the device reaching the thick film is reduced, thus increasing contrast between irradiated regions and regions protected by the protective layer in a self-aligned fabrication environment.

Wang et al in the Proceedings of the *SPIE—The International Society for Optical Engineering* (1999) vol. 3906, p. 619-24 describes the electrical characterization of polymer thick film resistors. Fukuda et al (U.S. Pat. No. 5,601,638) describes a thick film paste for use in the formation of circuit components. Ezaki (U.S. Pat. No. 5,362,927) reports a thick film hybrid circuit board device formed by lamination. Kazunori et al (JP 2001155626 A) provide a method for producing a display substrate. Takehiro and Shigeo (JP 10340666 A) describe a field emission element. Kazunori and Shinsuke ((JP 2001111217 A) provide a method of forming laminated wiring.

SUMMARY OF THE INVENTION

The present invention is composition of a material which can be fabricated to a photodefinable protective layer comprising a UV blocking agent selected from the group consisting of: nitro benzoic acid, methoxy benzoic acid, nitro naphthalic acid, methoxy naphthalic acid, 3,5 dimethoxy,4-hydroxy cinnamic acid, cinnamic acid and their other derivatives, 2 hydroxyl aryl benzotriazole and its derivatives, 2 hydroxy benzophenone and its derivatives, and anthracene sulfonic acid and its derivatives and a polymer in which at least 50 mole percent of the monomers in the polymer comprise a structure selected from the group consisting of:

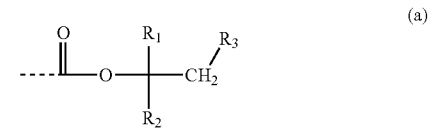

(a)

where $R_1$ is hydrogen or lower alkyl; $R_2$ is a lower alkyl; and $R_3$ is hydrogen or a lower alkyl where the definition of lower alkyl includes alkyl groups having 1 to 6 linear or cyclic carbon atoms;

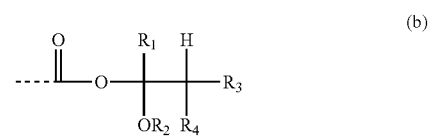

(b)

where $R_1$ is hydrogen or lower alkyl; $R_2$ is a lower alkyl; and $R_3$ and $R_4$ are independently hydrogen or a lower alkyl where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ to form a 5-, 6-, or 7-membered ring; and

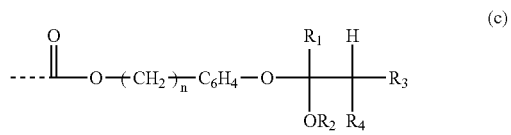

(c)

where $R_1$ is hydrogen or lower alkyl; $R_2$ is a lower alkyl; and $R_3$ and $R_4$ are independently hydrogen or a lower alkyl where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ to form a 5-, 6-, or 7-membered ring.

Suitable polymers for the above process are polymers selected from the group consisting of 1-ethoxyethyl methacrylate, 1-ethoxyethyl acrylate, 1-butoxyethyl methacrylate, 1-butoxyethyl acrylate, 1-ethoxy-1-propyl methacrylate, 1-ethoxy-1-propyl acrylate, tetrahydropyranyl methacrylate, tetrahydropyranyl acrylate, tetrahydropyranyl p-vinylbenzoate, 1-ethoxy-1-propyl p-vinylbenzoate, 4-(2-tetrahydropyranyloxy)benzyl methacrylate, 4-(2-tetrahydropyranyloxy)benzyl acrylate, 4-(1-butoxyethoxy)benzyl methacrylate, 4-(1-butoxyethoxy)benzyl acrylate t-butyl methacrylate, t-butyl acrylate, neopentyl methacrylate, neopentyl acrylate, 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives and 1-adamantyl methacrylate (or acrylate) and their derivatives.

Suitable UV blocking agents for the above process include compounds absorbing UV light in the range of 320 to 400 nm, commonly known as UV-A radiation, that have good solubility in the above mentioned polymers, and is easily removed by aqueous developer. Examples of the blocking agents include aromatic acids which absorbs g-line and I-line radiation. The examples of such acid are nitro benzoic acid, methoxy benzoic acid, nitro naphthalic acid, methoxy naphthalic acid, anthracene sulfonic acid, anthraquinon sulfonic acid, cinnamic acid, and 3,5 dimethoxy 4-hydroxy cinnamic acid. Another class of UV blocking agents are compounds which undergoes an excited state intramolecular proton transfer, and they can be exemplified with aromatic ketone and benzotriazole derivatives.

The present invention is further a process comprising coating an electronic device structure with a positive photo-imageable protective layer comprising a UV blocking agent and a polymer in which at least 50 mole percent of the monomers in the polymer comprise a structure selected from the group of materials cited above.

The present invention also includes an electronic device fabricated by the above process.

DETAILED DESCRIPTION

Figure 1:
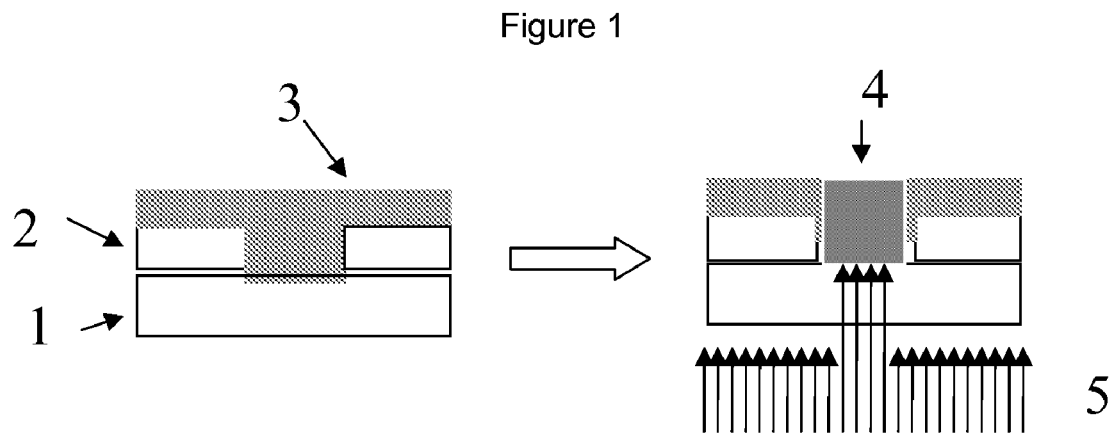
FIG. 1 shows self-alignment with an UV blocking protective film.

A self-aligned environment in device fabrication means that one of more layers of the device blocks radiation such that those layers function as a built-in photomask. The advantage of such a fabrication method is that the photo-patterning of subsequent layer does not need to be conducted with a carefully aligned external photomask. This enables shortening the fabrication time and the use of simpler equipment. The present invention addresses the photo-imageable protective polymer that can be used to enhance the contrast of a photo-definable thick film between the region which is directly irradiated and the region shielded by the protective polymer film. There is a potential problem related to compatibility of the thick film paste with protective layers. This may be addressed by fabricating a protective layer from positive photo-imageable materials which do not degrade or dissolve upon contact with the high boiling ester-type or ether-type solvents found in the photo-imageable thick film pastes, e.g. such solvents include butyl carbitol, butyl carbitol acetate, dibutyl carbitol, dibutyl phthalate, texanol and terpineol. The compatibility problem may be resolved by using polymers with pendant acid labile groups which upon either chemical treatment or photo-irradiation become insoluble to ester-type organic solvents used with thick film pastes. These polymer films, however, are highly transparent to high-pressure mercury lamp ultra violet radiation, typically used in photo fabrication. The mercury lamp radiation includes high intensity light at 365 nm (1-line) or 436 nm (g-line) radiation or broad band unfiltered light including g-line and I-line radiation. The UV radiation in this wavelength range is frequently called UV-A.

Self-alignment is mostly commonly achieved through back radiation. FIG. 1 depicts self-alignment with an UV blocking protective film. In FIG. 1, the substrate (1) is a transparent support material, glass or polymer film. The protective layer (2) is coated on the top of the substrate material and then photo-imaged to have a pattern. A photosensitive thick film paste material (3) is applied on top of the photo imaged protective layer. After evaporation of the solvent, UV radiation (5) is applied from the backside of the thick film paste, so that photo irradiated area would be hardened (4). The protective layer can decrease the radiation dose reaching to the photo-definable thick film paste. The degree of UV blocking depends on the thickness and UV absorption of the protective layer. The present invention addresses the photo-imageable protective polymer that can be used to enhance the contrast of photo-definable thick film between the region which is directly irradiated and the region irradiated through the protective polymer film.

Preferred UV blocking agents of this invention should meet several criteria. First, the blocking agents must absorb UV radiation, and it should be readily removed with a developing media used for the photoresistor. It also should have thermal and photochemical stability to withstand the fabrication process. Excessive heat could make some of compounds to decompose or sublime from the film.

UV blocking agents include aromatic acids which absorbs g-line and I-line radiation. The examples of such acids are nitro benzoic acid, methoxy benzoic acid, nitro naphthalic acid, methoxy naphthalic acid, anthracene sulfonic acid, anthraquinon sulfonic acid, cinnamic acid, and 3,5 dimethoxy 4-hydroxy cinnamic acid. Hindered amines are also known to block UV radiation, and a small amount of aromatic amine can be judiciously used as a blocking agent as long as the presence of the basic amine does not neutralize the acid, which catalyzes deprotection reaction.

Compounds generally known to undergo an excited state intramolecular proton transfer are particularly suitable for this application. This type of molecules has an intramolecularly hydrogen-bridged UV absorption through which in the excited singlet state $S_1$ opens a pathway for the transformation of ultraviolet radiation into thermal energy. Fundamental contributions to charge transfer in the excited state in general and the subsequent deactivation of excited hydrogen-bonded complexes is responsible for the dissipation of photo-energy to thermo-energy. The structural characteristic of these compounds is a phenolic-type hydroxy group adjacent to a carbonyl or an aromatic nitrogen proton acceptor, in a position that can form a virtual 6 membered or five membered transition state. This compound is not degraded by radiation, so that its efficiency is higher than one in blocking UV light by converting the photo-energy to thermal energy repeatedly. However, it has also been well established that the chemical characteristic of an additive itself is not alone the decisive factor for assessing the effectiveness of light protection. Examples of the compounds which belongs to this category includes 2-(2-hydroxyaryl)benzotriazoles (HBzTs), such as 2,4-Bis{[4-(2-ethyl-hexyloxy)-2-hydroxy]-phenyl}-6-(4-methoxyphenyl)-1,3,5-triazine 2-(2-hydroxyphenyl)-4,6-diaryl-1,3,5-triazines (HPTs), such as the 2-hydroxyphenyl-1,3,5-triazines, 2-(2'-hydroxyphenyl)-oxazole and -thiazole 3-hydroxyflavones, salicylic acid and it derivatives, such as 5-methoxy and or nitro salicylic acid, o-hydroxynaphthoic acids, benzophenone derivatives, such as o-Hydroxyacetophenone, 2-hydroxy-4-methoxybenzophenone; 2-hydroxy-4-methoxy-4'-methylbenzophenone; 1-hydroxy-2-acetonaphthone, 7-hydroxyquinoline, 7-hydroxy-1-indanone, 4-hydroxy-3-formylbenzoic acid, 3-hydroxychromone, 2-(2'-hydroxyphenyl)benzazoles, 2-hydroxy anthraquinone, phenolic compounds, such as 2-phenylphenol, o-hydroxystyrene, 2-(2'-cyclohexenyl)phenol, 2-(2'-Acetamidophenyl) benzimidazole, 2-acetylindan-1,3-dione.

Additives which can block the UV light by consuming the photoenergy through irreversible chemical modification can be also used. Cinnamic acid derivatives which absorb UV-A light, under goes [2,2] self cycloaddition, thus block the UV light.

Migration of UV absorber molecules out of the polymer, particularly surface blooming by thermal diffusion is serious drawback of these compounds, and it is influenced by the free volume of the polymer as well as by the size and shape of the diffusing molecules. Thus, the compound has to be selected to have good compatibility with the protective layer polymer and good solubility in the processing solvent, as well as high blocking efficiency.

Currently, novalac-type of phenolic formaldehyde polymeric materials are typically used as protective layers in the fabrication process of electronic devices utilizing photo-imageable thick film pastes, such as Fodel® silver paste commercialized by DuPont, Wilmington Del. The role of such a protective layer is to maintain spacing between the thick film deposit and other substrate structures to prevent contamination of the bottom substrate with the thick film paste. As mentioned above, in some cases, contamination of the bottom substrate may lead to short circuits. The protective layer is then removed by dissolution along with the unimaged thick film material is removed. Novalac-type phenolic polymer absorbs a sufficient amount of UV light, so that it does block UV light to a certain extent. Drawback of these protective layers, however, is that it is frequently found to be damaged during the process of applying the paste materials on the top of the protective layer. The cause of the damage is either the dissolution of the protective layer by solvent vapors generated during the paste drying process or plastic deformation of the resist material due to plastization by these vapors. Butyl carbitol, butyl carbitol acetate, dibutyl carbitol, dibutyl phthalate, texanol and terpineol are examples of the solvents currently used in thick film paste formulation.

The present invention uses protective materials that show either lower solubility or improved compatibility toward high boiling ester-type or ether-type solvent vapor so as to reduce the damage of the protective layer at same time the protective layer block UV light so that the photosensitive thick film layer on the top of the protective layer is not affected by the light irradiated from the backside. New polymers to be used as a protective layers in electronic device fabrication using photo-imageable thick film pastes must be soluble in an organic solvent so that the polymer can be applied as a thin film on the top of prefabricated device layers. Upon either chemical treatment or photo-irradiation the polymer becomes impervious to ester-type or ether-type organic solvents used in the formulation of the thick film paste. Since the polymer must undergo a photo-imaging step to be used as the protective layer, it must be formulated with a photo-responsive agent. A preferred polymer for this function contains a labile pendant group on a side acid functional group, which can be removed from the polymer pendant group at an appropriate time. One type of pendant acid labile groups useful in the compositions of this invention can be described by the formulae:

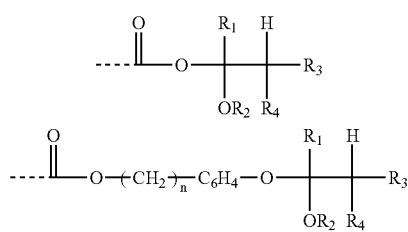

where n=0 to 4;

$R_1$ is hydrogen or lower alkyl; $R_2$ is lower alkyl; and $R_3$ and $R_4$ independently are hydrogen or lower alkyl where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ may be joined to form a 5-, 6-, or 7-membered ring.

Some examples of acid labile monomeric components that fall within the scope of the invention when used to prepare the polymeric material are:

1-ethoxyethyl methacrylate (or acrylate),
1-butoxyethyl methacrylate (or acrylate),
1-ethoxy-1-propyl methacrylate (or acrylate),
tetrahydropyranyl methacrylate (or acrylate),
tetrahydropyranyl p-vinylbenzoate,
1-ethoxy-1-propyl p-vinylbenzoate, 4-(2-tetrahydropyranyloxy)benzyl methacrylate (or acrylate),
4-(1-butoxyethoxy)benzyl methacrylate (or acrylate).

This is not meant to be a comprehensive list and the invention is not limited to these materials.

Another type of pendant acid labile groups useful in the compositions of this invention can be described by the formulae:

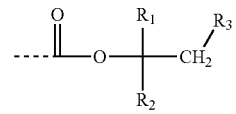

$R_1$ is hydrogen or lower alkyl; $R_2$ is lower alkyl; and $R_3$ is hydrogen or lower alkyl where the definition of lower alkyl includes alkyl groups having 1 to 6 linear or cyclic carbon atoms Some examples of acid labile monomeric components that fall within the scope of the invention when used to prepare the polymeric material are:

t-butyl methacrylate (or acrylate),
Neopentyl methacrylate (or acrylate)
1-Bicyclo{2,2,2}octyl methacrylate (or acrylate) and their derivatives
1-Bicyclo{2,2,1}heptyl methacrylate (or acrylate) and their derivatives
1-Bicyclo{2,1,1}hexyl methacrylate (or acrylate) and their derivatives
1-Bicyclo{1,1,1}pentyl methacrylate (or acrylate) and their derivatives
1-adamantyl methacrylate (or acrylate) and their derivatives This is not meant to be a comprehensive list and the invention is not limited to these materials.

The preferred molecular weight of these polymers is 7,000-1,000,000. It is also desirable to use copolymers, either random or block copolymers of monomer units containing those acid labile side groups and some other monomers which do not have acid labile pendant groups but have hydrophilic groups such as ethylene glycol ethers or carboxylic acid groups. Molecular weights higher than typical photoresist known in the field are preferred since the remaining polymer film has to withstand certain mechanical processes, such as screen printing. Mechanical stress is applied to the film with a rubber squeeze during or after the screen printing. In order to improve organic solvent resistance, it would be desirable to have a high amount of acid after the removal of the labile groups. The amount of monomer in the copolymer suitable for imperviousness to the organic vapor depends on the types of organic solvent used with the paste. The preferred mole fraction for the monomer containing labile ester group is 50%, and the more preferred mole percentage is higher than 60%.

Block copolymers can be prepared by well know methods in art, using methods typically known as living or controlled polymerization, like anionic or group transfer polymerization as well as atom transfer polymerization. The terms and techniques regarding living, controlled, and atom transfer polymerization are discussed in "Controlled/Living Radical Polymerization", edited by K. Matyjaszewski, Oxford University Press. Random copolymers can be obtained by solution polymerization using typical free radical initiator, such as organic peroxide and azo initiators. Discussion of these polymerization methods can be found in "Polymer Chemistry" Fifth Edition by C. E. Carraher Jr, Marcel Dekker Inc., New York, N.Y. (see Chapters 7, 8 and 9) or "Polymers" by S. L. Rosen in The Kirk-Othmer Encyclopedia of Chemical Technology, Fourth Edition, John Wiley and Sons Inc., New York (see volume 19, pp 899-901).

The photo-initiator is selected from common photo acid generators, such as aromatic sulfonium phosphofluoride or antimony fluoride, or aromatic iodonium salt with similar anions. The photo acid generators, and examples of such compounds, are described in a paper by J. V. Crivello, "The Chemistry of Photoacid Generating Compounds" in Polymeric Materials Science and Engineering, Vol. 61, American Chemical Society Meeting, Miami, Fla., Sep. 11-15, 1989, pp. 62-66 and references therein. The selected photo acid generator should not undergo decomposition or dissolution during the development stage. Nonionic photoacid generator, such as PI-105 (Midori Kagaku Co, Tokyo, Japan) or high molecular weight photo acid generator, such as Cyracure UVI 6976 (Dow, Midland, Mich.), CD-1012 (Aldrich Chemical, Milwaukee, Wis.) are examples of such photo acid generator.

The UV blocking agent is selected to have compatibility with all these additives, and should be soluble in the solvent. In addition, it should not decompose or be washed out during the radiation and development stages. The preferred UV blocking agents include 2-(2-hydroxyphenyl)benzotriazoles, 2,2'-dihydroxy-benzophenone; 3,5 dimethoxy 4-hydroxy cinnamic acid. The amount of UV blocking agent can be adjusted depending on the degree of UV blocking required. The amount of additional radiation required to generate a residue-free pattern with addition of a corresponding amount of UV blocking agent is a good indication how effectively blocking agent blocks light. The absolute value can change depending on the thickness of film and radiation source. The efficacy of the UV blocking agent depends on the absorptivity, energy dissipation mechanism as well as presence of impurities. Using a high pressure mercury lamp, one percent of 2-(2-hydroxyphenyl)benzotriazoles may require 3 J/cm$^2$ more and 3,5 dimethoxy 4-hydroxy cinnamic acid may require about 900 mJ/cm$^2$ more energy to have 98% confidence that the residue-free patterning would be photolytically created.

Carbon nanotubes (CNT) have been shown to have strong UV absorption as described by Chen et al for single-walled CNT (SWNT) (Science, 282:95-98, 1998) and by Jin et al for multi-walled CNT (MWNT) (Chemical Physics Letters, 318: 505-510, 2000). In one embodiment, carbon nanotubes can be selected as a sole UV blocking agent. In another embodiment, carbon nanotubes can be used together with other agent as an additional UV blocking agent. In yet another embodiment, a mixture of SWNT and MWNT can be used as a sole or an additional UV blocking agent.

To fabricate a device using the present invention, a 0.5 to 5 micron thick polymer coating of polymers with pendant labile acid groups and photo-active reagents is applied to a substrate. Such coatings could be achieved by spin coating or table coating using a blade in an appropriate organic solvent. The preferred organic solvents for applying the coating are propylene glycol 1-monomethyl ether 2-acetate (PGMEA) or cyclohexanone. Next, the solvent is removed by heating the substrate to between 70 to 100° C. for typically 1 to 3 minutes on a hot plate.

The coating is now ready to be patterned by UV photo-irradiation. UV irradiation followed by heat treatment will cleave acid labile pendant group to convert the ester to the acid. The UV photoirradiation source may use 193 nm laser radiation or a mercury lamp. For the higher wavelength than 248 nm may require addition of a small amount (10-10000 ppm) of photosensitizer which increases the absorption of UV light. The examples of photosensitizer include, but not limited to isopropylthioxanthone (ITX), 2,4-Diethyl-9H-thioxanthen-9-one (DETX), benzophenone. UV irradiation dose is 50 to 3000 mJ/square centimeter. Post exposed baking conditions are typically 120 to 140° C. for 1 to 3 minutes. This treatment causes the exposed area being soluble in an aqueous base developing solvent. The basic developing solvents may include a carbonate solution or a low concentration sodium or potassium hydroxide solution. Preferably, commercial aqueous base developer, such as AZ 300, 400 or 500, obtained from Clariant Corporation, AZ Electronic Materials Somerville, N.J. 08876-1258, can be used.

After development, a patterned template is formed. The remaining protective film is still soluble in organic solvents, thus its protective function toward the thick film paste is limited. The film can be converted to a film containing a high level of polycarboxylic acid which is insoluble in the common organic solvents employed in thick film pastes by exposure to UV light and subsequent heat treatment. The UV irradiation dose is 50 to 4000 mJ/square centimeter. Post exposed baking conditions are typically 120 to 140 C for 1 to 3 minutes.

The amount of UV blocking agent to the final polymer ranges between 0.1 to 20% by weight depending on the agents as a mixture with the polymer of the protective layer. The amount of the agent required for the application depends on the types of UV light, the thickness of the protective film and the abortion characteristics of the agent. Some of the agent could be sublimed during the heat treatment, and may undergo photolytic or thermal decomposition, so that the efficacy of UV blocking could be process dependent. Too much blocking agent will make the photoresist less sensitive, and may require a large amount of photo energy for photodevelopment. The amount of photoblocking agent can be modulated to be optimum condition for photodefinition and photoblocking.

The negatively imageable thick film paste of interest is aqueous base developable paste, such as Fodel silver paste commercialized by DuPont, Wilmington Del. It also includes such paste containing carbon nanotubes for field emission display applications. Thick film paste is applied on the top of the converted protective layer by such methods as screen printing, filling the vacancies in the patterned template generated by photo development. Subsequently, the thick film paste is photo irradiated from the back side of the structure. The paste located in the patterned template where the protective film is removed by photo-imaging would be imaged preferentially. The paste is negatively developed upon irradiation, so that the paste becomes insoluble to developing solvents. Typically, these thick film pastes are developed by gentle spray of an aqueous base solution. The unimaged paste is washed out within certain time which is called the time-toclear (TCC). Typically, the spray will last 1.5 to 3.0 times the TTC. The irradiated protective layer is soluble in the aqueous base solution so that it is removed while the unimaged thick film paste is being removed as it is spray developed.

EXAMPLES

Examples 1-9

3.590 grams of poly(ethoxytriethylene glycol methacrylate-b-t-butyl methacrylate), (with a degree of polymerization, D.P., of 37/100 and a number average molecular weight, Mn, of 10,000), 0.890 grams of homopolymer of t-butyl methacryllate (with D. P. equal to 5), 1.586 grams Cyracure® UVI-6976 solution (Dow Chemical), and 0.131 grams of a 2% Quanticure ITX (Aldrich) solution in Propylene glycol monomethyl ether acetate (PGMEA), 0.131 g of a 2% of 2,3-Diazabicyclo[3.2.2]non-2-ene, 1,4,4-trimethyl-, 2,3-dioxide (TAOBN) solution in PGMEA, and various amounts of a 1% solution of 2-hydroxy 4-methoxy benzophenone (0.06 g for example 1) in PGMEA were mixed with 8.328 g of PGMEA to give a clear solution.

Optionally, carbon nanotubes can be added to the solution to a final concentration between 0.1-20%. Sonication can be performed to disperse carbon nanotubes.

Using a 0.5 mil doctor blade, the solution was cast on an ITO-coated glass plate and allowed to air dry for 10 minutes. The film was then dried for 2 min at 70 degrees C. hot plate. The film was exposed with 300-3000 mJ/cm2 broad band UV light using a 20 micron photomask and then heat treated on a hot plate at 120 degrees C. for 2 min. The imaged part was developed by dipping into a 0.5% sodium carbonate solution. The photosensitivity as estimated from visual inspection of the image of the pattern in the photomask is given in Table 1.

TABLE 1

| Weight % of 2-hydroxy-4-methoxy benzophenone | Photo patterning with 600 mJ/cm2 |
|---|---|
| 0.1 | Good image |
| 0.2 | Good image |
| 0.5 | Good image |
| 1.0 | Good image |
| 2.0 | Good image |
| 4.0 | Latent image |
| 8.0 | Latent image |
| 16 | No image |
| 20 | No image |

Examples 10-13

3.273 grams of poly(ethoxytriethylene glycol methacrylate-b-t-butyl methacrylate), (D.P. 37/100, Mn 10,000), 0.327 grams of (D.P.=5) homopolymer of t-butyl methacryllate, 0.785 grams Cyracure® UVI-6976 solution (Dow Chemical), and 0.17 grams of a 1% Quanticure ITX (Aldrich) solution in PGMEA, 0.681 g of a 1% TAOBN solution in PGMEA, and various amount of 2-(2-Hydroxy-5-Methylphenyl) Benzotriazole (0.0225 g for example 10) were mixed in 4.74 g of PGMEA to a clear solution.

Optionally, carbon nanotubes can be added to the solution to a final concentration between 0.1-20%. Sonication can be performed to disperse carbon nanotubes.

Using a 0.5 mil doctor blade, the solution was cast on an ITO coated glass plate and allowed to air dry for 10 minutes. The film was then dried for 2 min at 70 degrees C. hot plate. The film was exposed with 300-3000 mJ/cm2 broad band UV light using a 20 micron photomask, then heat treated on a hot plate at 140 degrees C. for 2 min. The imaged part was developed by dipping into a 0.5% sodium carbonate solution. Table 2 lists the amount of radiation required to make a clean image of the pattern in the photomask as determined by visual inspection.

TABLE 2

| Weight % of 2-(2-Hydroxy-5-Methylphenyl) Benzotriazole | Amount of radiation (mJ/cm2) needed to make a clean image |
|---|---|
| 0.5 | 600 |
| 1.0 | 1200 |
| 2.0 | 2400 |
| 4.0 | 3000 |

Examples 14-16

3.273 grams of poly(ethoxytriethylene glycol methacrylate-b-t-butyl methacrylate), (D.P. 37/100, Mn 10,000), 0.327 grams of DP=5 homopolymer of t-butyl methacryllate, 0.785 grams Cyracure® UVI-6976 solution (Dow Chemical), and 0.17 grams of a 1% Quanticure ITX (Aldrich) solution in PGMEA, 0.681 g of a 1% TAOBN solution in PGMEA, and various amount of 3,5-dimethoxy-4-hydroxy-cinnamic acid (0.045 g for example 14) were mixed in 4.74 g of PGMEA to a clear solution.

Optionally, carbon nanotubes can be added to the solution to a final concentration between 0.1-20%. Sonication can be performed to disperse carbon nanotubes.

Using a 0.5 mil doctor blade, the solution was cast on an ITO coated glass plate and allowed to air dry for 10 minutes. The film was then dried for 2 min at 70 degrees C. hot plate. The film was exposed with 600-3000 mJ/cm2 broad band UV light using a 20 micron photomask, then heat treated on a hot plate at 140 degrees C. for 2 min. The imaged part was developed by dipping into a 0.5% sodium carbonate solution. Table 3 lists the amount of radiation required to make a clean image of the pattern in the photomask as determined by visual inspection.

TABLE 3

| Weight % of 2-(2-Hydroxy-5-Methylphenyl) Benzotriazole | Amount of radiation (mJ/cm2) needed to make a clean image |
|---|---|
| 1.0 | 1200 |
| 2.0 | 1800 |
| 3.0 | 1800 |

What is claimed is:

1. A process for fabricating an electronic device that comprises a substrate, comprising:
 (a) forming a protective layer on a first side of the substrate from a composition that comprises;
  (i) a UV blocking agent selected from the group consisting of nitro benzoic acid, methoxy benzoic acid, nitro naphthalic acid, methoxy naphthalic acid, cinnamic acid and its derivatives, anthracene sulfonic acid and its derivatives, and carbon nanotubes; and
  (ii) a polymer in which at least 50 mole percent of the monomers in the polymer comprise one or more of the structures (i), (ii) and (iii) described as follows:

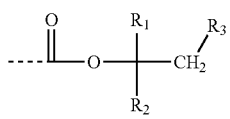
(A)

where $R_1$ is hydrogen or lower alkyl; $R_2$ is a lower alkyl; and $R_3$ is hydrogen or a lower alkyl, where the definition of lower alkyl includes alkyl groups having 1 to 6 linear or cyclic carbon atoms;

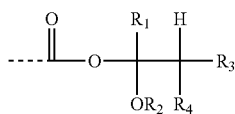
(B)

where $R_1$ is hydrogen or lower alkyl; $R_2$ is a lower alkyl; and $R_3$ and $R_4$ are independently hydrogen or a lower alkyl, where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ to form a 5-, 6-, or 7-membered ring; and

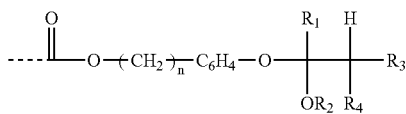
(C)

where $R_1$ is hydrogen or lower alkyl; $R_2$ is a lower alkyl; and $R_3$ and $R_4$ are independently hydrogen or a lower alkyl; where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ to form a 5-, 6-, or 7-membered ring; and where n is 0 to 4;

(b) irradiating the protective layer through a mask;
(c) heating the device;
(d) contacting the protective layer with a developing solution to remove the portions of the protective layer composition exposed to radiation in step (b), and thereby form a patterned protective layer;
(e) irradiating the patterned protective layer;
(f) heating the device;
(g) applying to the patterned protective layer a paste composition;
(h) irradiating the device from a second side of the substrate to form a pattern in the paste composition; and
(i) contacting the paste composition and the patterned protective layer with a developing solution to remove (I) the portions of the paste composition not exposed to radiation in step (h), and (II) the patterned protective layer.

2. A process according to claim 1 wherein the composition comprises a polymer in which at least 60 mole percent of the monomers in the polymer comprise one or more of the structures (A), (B) and (C).

3. A process according to claim 1 wherein the composition comprises a copolymer.

4. A process according to claim 1 wherein the composition comprises a polymer comprising, as a polymerized unit, a monomer having a hydrophilic group.

5. A process according to claim 1 wherein the composition comprises a UV blocking agent in an amount of about 1 to about 20 wt % based on the weight of the polymer.

6. A process according to claim 1 wherein the UV blocking agent is selected from the group consisting of 2 hydroxyl aryl benzotriazole and its derivatives.

7. A process according to claim 1 wherein the UV blocking agent is selected from the group consisting of 2 hydroxy benzophenone and its derivatives.

8. A process according to claim 1 wherein the thick film paste composition comprises silver or carbon nanotubes or both.

9. A process according to claim 1 wherein the substrate is transparent.

10. A process according to claim 1 wherein the UV blocking agent comprises 3,5 dimethoxy,4-hydroxy cinnamic acid.

* * * * *